United States Patent
Kim et al.

(10) Patent No.: US 8,809,688 B2
(45) Date of Patent: Aug. 19, 2014

(54) POLYAMIC ACID SOLUTION, POLYIMIDE RESIN AND FLEXIBLE METAL CLAD LAMINATE USING THE SAME

(75) Inventors: Yang Seob Kim, Seoul (KR); Won Kyum Kim, Yongin-si (KR); Hyung Wan Kim, Yongin-si (KR); Dong Bo Yang, Yongin-si (KR)

(73) Assignee: Doosan Corporation, Seoul (KR)

( * ) Notice: Subject to any disclaimer, the term of this patent is extended or adjusted under 35 U.S.C. 154(b) by 311 days.

(21) Appl. No.: 13/259,858

(22) PCT Filed: Apr. 2, 2010

(86) PCT No.: PCT/KR2010/002048
§ 371 (c)(1),
(2), (4) Date: Nov. 29, 2011

(87) PCT Pub. No.: WO2010/114338
PCT Pub. Date: Oct. 7, 2010

(65) Prior Publication Data
US 2012/0085570 A1 Apr. 12, 2012

(30) Foreign Application Priority Data
Apr. 3, 2009 (KR) .................. 10-2009-0029097

(51) Int. Cl.
*H05K 1/00* (2006.01)
(52) U.S. Cl.
USPC ............ 174/254; 428/1.1; 428/324; 428/421; 428/473.5; 428/474.4; 525/436; 528/107; 528/342; 528/353

(58) Field of Classification Search
USPC ............... 174/254; 428/1.1, 324, 421, 473.5, 428/474.4; 525/436; 528/107, 342, 353
See application file for complete search history.

(56) References Cited

U.S. PATENT DOCUMENTS

| | | | | |
|---|---|---|---|---|
| 4,910,068 A | * | 3/1990 | Takagi et al. | 428/847.1 |
| 4,963,645 A | * | 10/1990 | Inoue et al. | 528/342 |
| 5,139,849 A | * | 8/1992 | Takagi et al. | 428/143 |
| 5,231,162 A | * | 7/1993 | Nagata | 528/353 |
| 5,438,105 A | * | 8/1995 | Nagata | 525/436 |
| 5,916,688 A | * | 6/1999 | Tokuhisa et al. | 428/447 |
| 6,133,408 A | * | 10/2000 | Chiu et al. | 528/353 |
| 6,150,456 A | * | 11/2000 | Lee et al. | 524/606 |
| 6,159,611 A | * | 12/2000 | Lee et al. | 428/473.5 |

(Continued)

FOREIGN PATENT DOCUMENTS

| | | |
|---|---|---|
| CN | 1575092 A | 2/2005 |
| CN | 1720136 A | 1/2006 |

(Continued)

OTHER PUBLICATIONS

Japanese Patent Office, Japanese Office Action issued in corresponding JP Application No. 2012-503339, dated Oct. 18, 2013.

*Primary Examiner* — Xiaoliang Chen
(74) *Attorney, Agent, or Firm* — Sughrue Mion, PLLC

(57) ABSTRACT

Disclosed are a polyamic acid solution, a polyimide resin prepared by imidization of the polyamic acid solution, a flexible metal clad laminate using the polyimide resin, and a printed circuit board including the flexible metal clad laminate, wherein the polyamic acid solution includes (a) 3,3',4,4'-biphenyltetracarboxylic acid dianhydride (BPDA), and pyromellitic dianhydride (PMDA) as aromatic tetracarboxylic acid dianhydride; (b) at least one aromatic diamine; (c) an organic solvent; and (d) an inorganic filler.

14 Claims, 1 Drawing Sheet

(56) References Cited

U.S. PATENT DOCUMENTS

| | | | |
|---|---|---|---|
| 6,632,523 B1* | 10/2003 | Rosenfeld et al. | 428/355 R |
| 7,786,185 B2* | 8/2010 | Rathore et al. | 523/107 |
| 7,811,660 B2* | 10/2010 | Kaneshiro et al. | 428/220 |
| 2003/0144461 A1* | 7/2003 | Fujihara et al. | 528/288 |
| 2004/0132900 A1 | 7/2004 | Sachdev et al. | 524/606 |
| 2004/0249019 A1* | 12/2004 | Meyer et al. | 523/200 |
| 2004/0249041 A1* | 12/2004 | Meloni | 524/430 |
| 2004/0260053 A1* | 12/2004 | Yen-Huey et al. | 528/275 |
| 2004/0265731 A1* | 12/2004 | Okada et al. | 430/270.1 |
| 2005/0014925 A1* | 1/2005 | Yokota et al. | 528/353 |
| 2005/0112362 A1* | 5/2005 | Yen-Huey et al. | 428/324 |
| 2005/0143534 A1* | 6/2005 | Dueber et al. | 525/476 |
| 2005/0238896 A1* | 10/2005 | Itoh et al. | 428/473.5 |
| 2006/0083939 A1* | 4/2006 | Dunbar et al. | 428/473.5 |
| 2006/0124693 A1* | 6/2006 | Meloni | 228/56.3 |
| 2006/0127686 A1* | 6/2006 | Meloni | 428/473.5 |
| 2006/0210819 A1* | 9/2006 | Dueber | 428/474.4 |
| 2006/0286364 A1* | 12/2006 | Lee et al. | 428/323 |
| 2007/0009751 A1* | 1/2007 | Hwang et al. | 428/473.5 |
| 2007/0025740 A1* | 2/2007 | Katoh et al. | 399/1 |
| 2007/0066734 A1* | 3/2007 | Ding et al. | 524/404 |
| 2007/0071910 A1* | 3/2007 | Ono et al. | 428/1.1 |
| 2007/0149758 A1* | 6/2007 | Wang et al. | 528/310 |
| 2007/0154631 A1* | 7/2007 | Sachdev et al. | 427/140 |
| 2007/0169886 A1* | 7/2007 | Watanabe et al. | 156/325 |
| 2007/0218277 A1* | 9/2007 | Ono et al. | 428/355 R |
| 2007/0231568 A1* | 10/2007 | Kanakarajan | 428/343 |
| 2007/0231588 A1* | 10/2007 | Kanakarajan et al. | 428/458 |
| 2007/0232734 A1* | 10/2007 | Kanakarajan et al. | 524/413 |
| 2008/0107457 A1* | 5/2008 | Katoh | 399/302 |
| 2008/0138537 A1* | 6/2008 | Simone et al. | 428/1.1 |
| 2008/0182115 A1* | 7/2008 | Briney et al. | 428/473.5 |
| 2008/0213605 A1* | 9/2008 | Briney et al. | 428/473.5 |
| 2008/0305316 A1* | 12/2008 | Kaneshiro et al. | 428/220 |
| 2009/0022939 A1* | 1/2009 | Yanagida et al. | 428/101 |
| 2009/0069531 A1* | 3/2009 | Kaneshiro et al. | 528/322 |
| 2009/0078453 A1* | 3/2009 | Jung | 174/254 |
| 2009/0142567 A1* | 6/2009 | Kanakarajan et al. | 428/220 |
| 2009/0226642 A1* | 9/2009 | Simone et al. | 428/1.33 |
| 2009/0242823 A1* | 10/2009 | Kanakarajan et al. | 252/62.3 Q |
| 2009/0263639 A1* | 10/2009 | Dunbar et al. | 428/220 |
| 2009/0263640 A1* | 10/2009 | Ding et al. | 428/220 |
| 2009/0297858 A1* | 12/2009 | Glenn et al. | 428/421 |
| 2010/0048861 A1* | 2/2010 | Jung et al. | 528/347 |
| 2010/0096164 A1* | 4/2010 | Kikuchi et al. | 174/254 |
| 2010/0226016 A1* | 9/2010 | Hirauchi et al. | 359/614 |
| 2010/0273974 A1* | 10/2010 | Yoshida et al. | 528/229 |
| 2010/0317821 A1* | 12/2010 | Jung et al. | 528/183 |
| 2011/0124806 A1* | 5/2011 | Simmons et al. | 524/600 |
| 2011/0165410 A1* | 7/2011 | Aoyagi et al. | 428/325 |
| 2011/0229680 A1* | 9/2011 | Glenn et al. | 428/68 |
| 2011/0311796 A1* | 12/2011 | Jung et al. | 428/220 |
| 2012/0018197 A1* | 1/2012 | Park et al. | 174/254 |

FOREIGN PATENT DOCUMENTS

| | | |
|---|---|---|
| CN | 1752143 A | 3/2006 |
| CN | 100999589 A | 7/2007 |
| CN | 101007899 A | 8/2007 |
| JP | 63-095264 A | 4/1988 |
| JP | 63-161023 A | 7/1988 |
| JP | 04-266082 A | 9/1992 |
| JP | 2002-050840 A | 2/2002 |
| JP | 2003-277502 A | 10/2003 |
| JP | 2008-511475 A | 4/2008 |
| KR | 10-0786185 A | 12/2007 |
| WO | 2004/050352 A1 | 6/2004 |

* cited by examiner

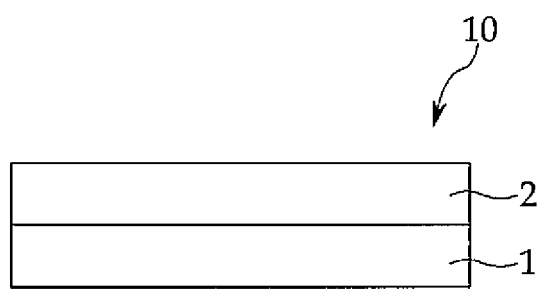

POLYAMIC ACID SOLUTION, POLYIMIDE RESIN AND FLEXIBLE METAL CLAD LAMINATE USING THE SAME

CROSS-REFERENCE TO RELATED APPLICATIONS

This application is a National Stage of International Application No. PCT/KR2010/002048 filed Apr. 2, 2010, claiming priority based on Korean Patent Application No. 10-2009-0029097 filed Apr. 3, 2009, the contents of all of which are incorporated herein by reference.

TECHNICAL FIELD

The present invention relates to a polyamic acid solution, a polyimide resin for preparing a flexible metal clad laminate, the flexible metal clad laminate using the polyimide resin, and a printed circuit board including the flexible metal clad laminate, in which the polyimide resin is prepared by the polyamic acid solution and has an improved adhesive strength with respect to a bonding prepreg.

BACKGROUND ART

A flexible copper clad laminate (FCCL) is mainly used as a substrate for a flexible printed circuit board (FPCB), and also used for a surface heating element electromagnetic wave shielding material, a flat cable, a packaging material, and the like. As an electronic device employing a PCB has recently gradually become small-sized, highly densified, and highly effective, the use of a FCCL has been further increased.

The FCCL includes a polyimide layer and a copper clad layer. Such a FCCL is prepared by laminating a copper clad layer onto a polyimide film, or prepared by laminating a polyimide layer onto a copper clad layer. In other words, the FCCL is prepared by an adhesive method, or by a cast method.

The FCCL prepared by the adhesive method is prepared by attaching a copper clad layer on a polyimide film via an epoxy adhesive. In the case of such a FCCL, the adhesive film is weak to heat, and under high temperature.high pressure environment, copper ions of the copper clad layer are moved into the adhesive film layer, thereby causing a short between circuit wirings. In other words, properties such as heat resistance, chemical resistance, flame retardancy and electrical characteristics of a final FCCL depend on the characteristics of the used adhesive film. Accordingly, the polyimide resin cannot sufficiently exhibit its natural characteristics such as high flexibility and heat resistance.

Meanwhile, unlike the FCCL prepared by the adhesive method, the FCCL prepared by the cast method is prepared by applying polyimide varnish on a copper clad layer, carrying out heat treatment under an appropriate condition, and then forming a polyimide resin layer on the copper clad layer, without an adhesive.

However, in the FCCL prepared by the cast method, curling occurs due to a difference in thermal expansion coefficients between the polyimide layer and the copper clad. Thus, in order to prevent the curling, various FCCL preparation methods have been developed.

Especially, a method for preparing a FCCL by varying a thermal expansion coefficient of a polyimide resin layer with respect to a copper clad has been widely used. In a FCCL prepared by this method, it is possible to prevent the curling due to improvement of heat resistance or flexibility, but there is a problem in that the adhesive strength of the polyimide resin layer is decreased. For this reason, it was difficult to adhere the FCCL to a bonding sheet (bonding prepreg) used for preparation of a multilayer flexible circuit board, thereby declining the applicability of the FCCL in the multilayer flexible PCB.

Accordingly, in the preparation of a FCCL, it is required to develop a novel polyimide resin with improved adhesive strength as well as improved various performances such as heat resistance and flexibility.

DISCLOSURE

Technical Problem

Through repetitive experiments, the inventors of the present invention found that when 3,3',4,4'-biphenyltetracarboxylic acid dianhydride (BPDA) and pyromellitic dianhydride (PMDA) are used as aromatic tetracarboxylic acid dianhydride, it is possible to prepare a polyimide resin layer having a high adhesive strength with respect to a bonding prepreg used for the preparation of a multilayer printed circuit board without deterioration of various properties such as flexibility, curling, heat resistance, chemical resistance, electrical characteristics. The present invention is based on this finding.

Technical Solution

The present invention provides a polyamic acid solution and a polyimide resin prepared by imidization of the polyamic acid solution, wherein the polyamic acid solution includes (a) 3,3',4,4'-biphenyltetracarboxylic acid dianhydride (BPDA), and pyromellitic dianhydride (PMDA) as aromatic tetracarboxylic acid dianhydride; (b) at least one aromatic diamine; (c) an organic solvent; and (d) an inorganic filler.

Also, the present invention provides a polyamic acid solution and a polyimide resin prepared by imidization of the polyamic acid solution, wherein the polyamic acid solution includes (a) at least one aromatic tetracarboxylic acid dianhydride; (b) at least one aromatic diamine; (c) an organic solvent; and (d) an inorganic filler, wherein said at least one aromatic tetracarboxylic acid dianhydride (a) and said at least one aromatic diamine (b) are mixed in a ratio range of a:b=1.05:1.00~1.00:1.05 mol.

Also, the present invention provides a flexible metal clad laminate and a printed circuit board including the same, wherein the flexible metal clad laminate includes a metal clad layer; and the above described polyimide resin layer formed on one surface of the metal clad layer.

Also, the present invention provides a method for preparing a flexible metal clad laminate, the method including the steps of: coating the above described polyamic acid solution on a metal clad; and heating the polyamic acid solution coated on the metal clad so as to form a polyimide resin layer on the metal clad.

BRIEF DESCRIPTION OF THE DRAWINGS

FIG. 1 is a cross sectional view of a flexible metal clad laminate using a polyimide resin prepared through imidization of a polyamic acid solution according to the present invention.

DESCRIPTION OF THE INDICATION

1: metal clad layer,
2: polyimide resin layer,
3: metal clad laminate

MODE FOR INVENTION

Hereinafter, the present invention will be described in detail.

The polyamic acid solution of the present invention which can be used for a flexible metal clad laminate includes: (a) 3,3',4,4'-biphenyltetracarboxylic acid dianhydride, (BPDA), and pyromellitic dianhydride (PMDA) as aromatic tetracarboxylic acid dianhydride; (b) at least one aromatic diamine; (c) an organic solvent; and (d) an inorganic filler. Accordingly, it is possible to prepare a polyimide resin with improved adhesive strength without deterioration of various properties such as flexibility, curling, heat resistance, chemical resistance, electrical characteristics. Also, a flexible metal clad laminate using such a polyimide resin can be easily adhered to a bonding prepreg due to the polyimide resin with an improved adhesive strength, and thus can be easily used in a multilayer printed circuit board (PCB) such as a multi-layer flexible PCB and a rigid flexible PCB.

The polyamic acid solution of the present invention includes a mixture of BPDA (a1) with PMDA (a2), as at least one aromatic tetracarboxylic acid dianhydride (a). Herein, it is appropriate that the mixing ratio of BPDA (a1) to PMDA (a2) is in a range of 50 to 95:5 to 50 mol %, and preferably in a range of 60 to 90:10 to 40 mol %. If the ratio of PMDA (a2) is less than 5 mol %, the adhesive strength with respect to the bonding prepreg is lowered, and on the other hand, if the ratio of PMDA (a2) is greater than 50 mol %, peel strength and flexibility of the polyimide resin layer to be formed later on, with respect to the metal clad (ex. copper clad), may be lowered.

The polyamic acid solution of the present invention includes at least one aromatic diamine (b) which forms a polyimide resin through imidization with the aromatic tetracarboxylic acid dianhydride (a) including BPDA and PMDA.

Non-limiting examples of the aromatic diamine (b) include p-phenylene diamine (p-PDA), m-phenylene diamine (m-PDA), 4,4'-oxydianiline (4,4'-ODA), 2,2-bis(4-4[aminophenoxy]-phenyl)propane (BAPP), 2,2'-Dimethyl-4,4'-diaminobiphenyl (m-TB-HG), 1,3-bis(4-aminophenoxy)benzene (TPE-R), 2,2-bis(4-[3-aminophenoxy]phenyl)sulfone (m-BAPS), 4,4'-diamino benzanilide (DABA), and 4,4'-bis(4-aminophenoxy)biphenyl, etc. These aromatic diamine can be used alone or in a mixture of two or more thereof.

Preferably, as said at least one aromatic diamine (b), p-phenylenediamine (p-PDA) (b1) is used in combination with 4,4'-oxydianiline (ODA) (b2). Herein, it is appropriate that the mixing ratio of p-phenylenediamine (p-PDA) (b1) to 4,4'-oxydianiline (ODA) (b2) is in a range of 50 to 90:10 to 50 mol %, and preferably in a range of 55 to 85:15 to 45 mol %. If the ratio of p-phenylenediamine (p-PDA) (b1) is less than 50 mol %, flexibility, curling, and dimensional stability of a metal clad laminate using a polyimide resin to be formed later on may be lowered. On the other hand, if the ratio of p-phenylenediamine (p-PDA) (b1) is greater than 90 mol %, the peel strength of a polyimide resin layer to be formed later on, with respect to a metal clad (ex. copper clad), may be lowered.

In the present invention, in order to improve the adhesive strength of a polyimide resin to be formed later on, especially with respect to a bonding prepreg, the above described aromatic tetracarboxylic acid dianhydride (a) including BPDA and PMDA and at least one aromatic diamine (b) are mixed in a ratio range of a:b=1.05:1.00~1.00:1.05 mol. If the mixing ratio of aromatic tetracarboxylic acid dianhydride to aromatic diamine is out of the above mentioned range, the polyimide resin (layer) may be not properly formed later on due to insufficiency of the viscosity of the polyamic acid solution.

The polyamic acid solution of the present invention includes the inorganic filler in order to reduce the difference in coefficients of thermal expansion (CTE) between the polyimide resin and the metal clad later on.

Non-limiting examples of the inorganic filler that may be used in the present invention include talc, mica, silica, calcium carbonate, magnesium carbonate, clay, calcium silicate, titanium oxide, antimony oxide, glass fiber, or a mixture thereof. Especially, the use of talc is preferable because it can further improve the adhesive strength of the polyimide resin to be formed later on. It is appropriate that such an inorganic filler is used in an amount of about 1 to 25 wt %, and preferably of about 10 to 20 wt %, with respect to the total weight of aromatic tetracarboxylic acid dianhydride (including BPDA and PMDA) and at least one aromatic diamine, in order to reduce the difference in CTEs between the polyimide resin and the metal clad, and to improve the adhesive strength of the polyimide resin, especially with respect to the prepreg.

The inorganic filler has an average diameter of about 0.05 to 50 μm, and preferably of about 0.1 to 10 μm.

Non-limiting examples of a solvent that may be used in the polyamic acid solution of the present invention may include N-methylpyrrolidinone (NMP), N,N-dimethylacetamide (DMAc), tetrahydrofuran (THF), N,N-dimethylformamide (DMF), dimethylsulfoxide (DMSO), cyclohexane, acetonitrile, etc. These solvent can be used alone or a mixture of two or more thereof.

Meanwhile, the polyamic acid solution of the present invention may further include an epoxy resin in order to further improve the adhesive strength of polyimide resin. Herein, a halogen-based epoxy resin may be used. However, it is preferable to use an environmentally friendly halogen-free epoxy resin that does not include halogen atoms (such as bromine) within its molecule.

There is no limitation in the epoxy resin. For example, the epoxy resin may contain silicone, urethane, polyimide, polyamide, etc., and also may include a phosphorus atom, a sulfur atom, a nitrogen atom, etc. within its frame. Examples of such an epoxy resin may include bisphenol A epoxy resin, bisphenol F epoxy resin, hydrogenated bisphenol A or F epoxy resin, glycidyl ether epoxy resin (such as phenolic novolak epoxy resin, cresol novolak epoxy resin), glycidyl ester epoxy resin (such as hexahydrophthalic acid glycidyl ester, dimmer acid glycidyl ester), glycidyl amine epoxy resin (such as triglycidylisocyanurate, tetraglycidyl diamino diphenyl methane), linear aliphatic epoxy resin (such as epoxidized polybutadiene, epoxidized soybean oil), and the like. Preferably, examples of the epoxy resin may include bisphenol A epoxy resin, bisphenol F epoxy resin, phenolic novolak epoxy resin, and cresol novolak epoxy resin.

It is appropriate that such an epoxy resin is included in the polyamic acid solution in an amount of about 1 to 10 wt %, and preferably of about 1 to 5 wt %, with respect to the total weight of aromatic tetracarboxylic acid dianhydride (including BPDA and PMDA) and at least one aromatic diamine. If the epoxy resin is included in an amount of less than 1 wt %, the adhesive strength of the polyimide resin to be formed later on, especially with respect to a bonding prepreg, is not sufficiently improved. On the other hand, if the epoxy resin is included in an amount of greater than 10 wt %, the flexibility and the heat resistance of the polyimide resin to be formed later on may be lowered.

In the polyamic acid solution of the present invention, the total concentration of solid matters (that is, at least one aromatic tetracarboxylic acid dianhydride, at least one aromatic diamine, and the inorganic filler) except for an organic solvent ranges from about 10 to 50 wt %, and preferably from about 10 to 35 wt %. When the total concentration of the solid matters does not satisfy the above mentioned range, the coating uniformity of the polyamic acid solution with respect to a metal clad is lowered, thereby lowering work efficiency. Further, during a coating process, due to non-uniformity in the thickness of the polyimide resin layer, the coatability may be lowered.

If necessary, the polyamic acid solution of the present invention may further include other additives, such as plasticizers, antioxidants, flame retardants, dispersants, viscosity modifiers, leveling agents, etc. in small amounts within the range not significantly impairing the objects and effects of the present invention.

The viscosity of the polyamic acid solution according to the present invention is not particularly limited, but may be a range of about 3,000 to 50,000 cps, and preferably of about 15,000 to 40,000 cps.

In the present invention, through imidization of the above described polyamic acid solution, a random copolymer of polyimide resin or a block copolymer of polyimide resin may be prepared. Herein, the prepared polyimide resin is a polymer material containing an imide ring, and is excellent in adhesive strength as well as heat resistance, chemical resistance, abrasion resistance, and electrical characteristics. Especially, the polyimide resin is excellent in adhesive strength with respect to a bonding prepreg used for later formation of a PCB (such as a multilayer flexible printed wiring board or rigid-flex printed wiring board).

It is appropriate that the weight-average molecular weight of the polyimide resin may be a range of about 100,000 to 200,000.

In the preparation of such a polyimide resin, it is appropriate that the imidization temperature of the above mentioned polyamic acid solution, that is, the reaction temperature, ranges from about 250 to 400° C., and the reaction time ranges from about 5 to 50 minutes.

Meanwhile, the present invention provides a flexible metal clad laminate using the above described polyimide resin, preferably flexible copper clad laminate.

A flexible metal clad laminate 10 according to one embodiment of the present invention, as shown in FIG. 1, includes a metal clad layer 1; and a polyimide resin layer 2 formed on one surface of the metal clad, wherein the polyimide resin layer is formed by imidization of the above described polyamic acid solution. Herein, the polyimide resin layer is excellent in adhesive strength as well as heat resistance, flexibility, curling, electrical characteristics, and thus can be easily adhered to a bonding prepreg to be used for later formation of a PCB.

There is no limitation in a metal of the metal clad layer 1 as long as it is a conductive and flexible metal. For example, the metal may be copper, tin, gold, or silver. Preferably, the metal is copper. When the metal clad is a copper clad, it may be rolled copper foil or electrolytic copper foil.

There is no limitation in the thickness of the metal clad layer 1. The thickness of the metal clad layer may range from about 5 to 40 μm, and preferably from about 9 to 35 μm.

There is no limitation in the thickness of the polyimide resin layer 2. The thickness of the polyimide resin layer may range from about 2 to 60 μm, and preferably from about 3 to 30 μm.

Also, the polyimide resin layer 2 has a coefficient of thermal expansion (CTE) ranging from about 10 to 30 ppm/° C. Also, its peel strength with respect to a metal clad (ex. copper clad) is 0.80 kgf/cm or more, and preferably about 1.00 kgf/cm or more, and its peel strength with respect to a bonding prepreg is about 0.70 kgf/cm or more, and preferably about 1.00 kgf/cm or more.

The method for preparing a flexible metal clad laminate according to the present invention is described below, but the present invention is not limited thereto. According to one preferred embodiment, the method for preparing a flexible metal clad laminate may include the steps of: coating the above described polyamic acid solution on the metal clad; and heating the polyamic acid solution coated on the metal clad to form a polyimide resin layer on the metal clad.

Also, according to another preferred embodiment of the present invention, the method may include the steps of: coating the above described polyamic acid solution on the metal clad; heating the polyamic acid solution coated on the metal clad to form a polyimide resin layer on the metal clad; and performing atmospheric plasma treatment on the surface of the polyimide resin layer.

First, 1) the prepared polyamic acid solution is coated on the surface of the metal clad.

The polyamic acid solution is prepared by dissolving at least one aromatic tetracarboxylic acid dianhydride, at least one aromatic diamine, and an inorganic filler in an organic solvent. Herein, the viscosity of the prepared polyamic acid solution is not particularly limited, but may be a range of about 3,000 to 50,000 cps, and preferably of about 15,000 to 40,000 cps.

In coating of the prepared polyamic acid solution on the metal clad, the thickness of the coated polyamic acid solution may vary according to concentrations. However, it is appropriate that the polyamic acid solution is coated in such a manner that the final thickness of the polyimide resin layer after the imidization reaction can range from about 2 to 60 μm, and preferably from about 3 to 30 μm.

2) Then, when the polyamic acid solution coated on the metal clad is heated, a polyimide resin layer is formed on the metal clad through an imidization reaction of at least one aromatic tetracarboxylic acid dianhydride with at least one aromatic diamine.

Herein, it is appropriate that the heating temperature ranges from about 250 to 400° C., and the heating time ranges from about 5 to 50 minutes.

3) In the present invention, in order to further improve the adhesive strength between the formed polyimide resin layer and a bonding prepreg, the surface of the polyimide resin layer may be subjected to atmospheric plasma treatment. Through the atmospheric plasma treatment, the surface of the polyimide resin layer is formed with a carboxyl group, thereby improving the adhesive strength with respect to the bonding prepreg. This allows a PCB (such as a multilayer flexible printed wiring board or rigid-flex printed wiring board) to be easily formed. Furthermore, through the use of such an atmospheric plasma treatment, it is possible to improve the stability of a process, and to carry out a continuous process.

The gas that may be used in the atmospheric plasma treatment is not particularly limited, but may be argon gas, oxygen gas, nitrogen gas, helium gas or a mixture thereof. The amount of the gas to be injected is not particularly limited, but may appropriately range from 10 to 800 sccm, and preferably range from 50 to 500 sccm.

An atmospheric plasma generator using such a gas, that may be used in the present invention, may have a treatment speed of from about 0.1 to 10 m/min, and a distance between an electrode and a polyimide resin layer of from about 1 to 10 mm, but the present invention is not limited thereto.

The strength of atmospheric plasma generated by such an atmospheric plasma generator may range from about 2 to 50 kV, and preferably range from about 5 to 30 kV. It is appropriate to treat the surface of the polyimide resin layer with atmospheric plasma having the above mentioned strength at a rate of from about 0.1 to 10 m/min.

Further, the present invention provides a PCB provided comprising the above described flexible metal clad laminate. The PCB may be a multi-layer flexible PCB or a rigid flexible PCB. Such a PCB can continuously show excellent various performances (such as heat resistance, insulation withstand capability, flexibility, flame retardancy, chemical resistance, and adhesive strength) caused by the polyimide resin layer in the flexible metal clad laminate, thereby contributing to high functionality and long lifetime of various kinds of electronic devices.

Meanwhile, the present invention provides a polyamic acid solution which includes: (a) at least one aromatic tetracarboxylic acid dianhydride; (b) at least one aromatic diamine; (c) an organic solvent; and (d) an inorganic filler, wherein the mixing ratio of said at least one aromatic tetracarboxylic acid dianhydride (a) to said at least one aromatic diamine (b) is in a range of 1.05:1.00 to 1.00:1.05 mol.

Hereinafter, the present invention will be described in more detail with reference to Examples and Experimental Examples. However, Examples and Experimental Examples, as described below are illustrative only, and do not limit the present invention.

Example 1

1-1. Preparation of a Polyamic Acid Solution

Through a 4-neck reaction vessel provided with a thermometer, a stirrer, a nitrogen inlet and a powder dispensing funnel, nitrogen gas was slowly passed, while 166 ml of N-methyl pyrrolidone (NMP) and 6.8 g (20 wt %) of talc powder were added, followed by stirring. To the solution, 7.11 g (0.0657 mol) of p-phenylenediamine (p-PDA) and 3.32 g (0.0166 mol) of 4,4'-oxydianiline (ODA) were added, and the resultant mixture was completely dissolved by being stirred at 25° C. To the resultant solution, 21.77 g (0.0740 mol) of 3,3',4,4'-biphenyltetracarboxylic acid dianhydride (BPDA) and 1.79 g (0.0082 mol) of pyromellitic dianhydride (PMDA) were slowly added, and the mixture was polymerized by being stirred for 10 hours so as to provide a polyamic acid solution having a viscosity of 25,000 cps.

1-2. Fabrication of Flexible Copper Clad Laminate

By using a casting method, the prepared polyamic acid solution was coated on the surface of an electrolytic copper clad having a thickness of 18 μm. Herein, the thickness of the coating was adjusted in such a manner that the thickness of the final polyimide resin layer after the curing step can be 25 μm. Then, the coated polyamic acid solution was dried at from about 50 to 200° C. through several steps for from about 10 to 40 minutes. Then, the temperature was raised up to about 250 to 400° C. while an imidization reaction was carried out so as to provide a flexible copper clad laminate formed with a polyimide layer.

Example 2

By using an atmospheric plasma generator, on the surface of the polyimide layer of the flexible copper clad laminate obtained from Example 1-2, atmospheric plasma treatment was carried out.
<Conditions for Atmospheric Plasma Treatment>
gas: argon gas, oxygen gas, nitrogen gas
strength of plasma: 7 kV
distance between an electrode and a polyimide layer: 5 mm
treatment speed: 1 m/min

[Example 3] to [Example 8], and [Comparative Example 1] to [Comparative Example 7]

As noted in Tables 1 and 2 below, a polyamic acid solution and a flexible copper clad laminate were prepared in the same manner as described in Example 2, except that the contents of p-phenylenediamine (p-PDA), 4,4'-oxydianiline (ODA), 3,3', 4,4'-biphenyltetracarboxylic acid dianhydride (BPDA), pyromellitic dianhydride (PMDA), and talc were changed.

TABLE 1

|  |  | Exp1 | Exp2 | Exp3 | Exp4 | Exp5 | Exp6 | Exp7 | Exp8 |
| --- | --- | --- | --- | --- | --- | --- | --- | --- | --- |
| BPDA | Amount (g) | 21.77 | 21.77 | 20.75 | 20.52 | 19.65 | 17.58 | 12.9 | 13.065 |
|  | Mol | 0.0740 | 0.0740 | 0.0705 | 0.0697 | 0.0668 | 0.0598 | 0.0438 | 0.044 |
| PMDA | Amount (g) | 1.79 | 1.79 | 2.71 | 2.68 | 2.57 | 5.59 | 9.56 | 9.68 |
|  | Mol | 0.0082 | 0.0082 | 0.0124 | 0.0123 | 0.0118 | 0.0256 | 0.0438 | 0.0444 |
| PMDA/(BPDA + PMDA) |  | 0.10 | 0.10 | 0.15 | 0.15 | 0.15 | 0.30 | 0.50 | 0.50 |
| p-PDA | Amount (g) | 7.11 | 7.11 | 7.18 | 6.66 | 4.67 | 7.38 | 7.11 | 7.68 |
|  | Mol | 0.0657 | 0.0657 | 0.0664 | 0.0616 | 0.0432 | 0.0682 | 0.0657 | 0.0710 |
| ODA | Amount (g) | 3.32 | 3.32 | 3.36 | 4.14 | 7.11 | 3.45 | 4.42 | 3.59 |
|  | Mol | 0.0166 | 0.0166 | 0.0168 | 0.0207 | 0.0355 | 0.0172 | 0.0221 | 0.0179 |
| p-PDA/(p-PDA + ODA) |  | 0.80 | 0.80 | 0.80 | 0.75 | 0.55 | 0.80 | 0.75 | 0.80 |
| Diamine/Dianhydride |  | 1.0016 | 1.0016 | 1.0028 | 1.0029 | 1.0017 | 1.0012 | 1.0017 | 1.0021 |
| Talc | Amount (g) | 6.80 | 6.80 | 6.80 | 6.80 | 6.80 | 6.80 | 6.80 | 6.80 |
|  | Ratio (wt %) | 20 | 20 | 20 | 20 | 20 | 20 | 20 | 20 |
| NMP (ml) |  | 166 | 166.00 | 166.00 | 166.00 | 166.00 | 166.00 | 166.00 | 166.00 |
| Amount of solid matters (wt %) |  | 19.72 | 19.72 | 19.73 | 19.73 | 19.73 | 19.73 | 19.72 | 19.73 |
| Plasma treatment |  | x | ○ | ○ | ○ | ○ | ○ | ○ | ○ |

TABLE 2

|  |  | Comp. Exp1 | Comp. Exp2 | Comp. Exp3 | Comp. Exp4 | Comp. Exp5 | Comp. Exp6 | Comp. Exp7 |
|---|---|---|---|---|---|---|---|---|
| BPDA | Amount (g) | 23.75 | 23.75 | 23.75 | 0 | 23.17 | 10.66 | 16.92 |
|  | Mol | 0.0807 | 0.0807 | 0.0807 | 0 | 0.0788 | 0.0362 | 0.0575 |
| PMDA | Amount (g) | 0 | 0 | 0 | 21.5 | 0.53 | 11.85 | 2.69 |
|  | Mol | 0.0000 | 0.0000 | 0.0000 | 0.0986 | 0.0024 | 0.0543 | 0.0123 |
| BTDA | Amount (g) | 0 | 0 | 0 | 0 | 0 | 0 | 3.97 |
|  | Mol | 0 | 0 | 0 | 0 | 0 | 0 | 0.0123 |
| PMDA/(BPDA + PMDA) or PMDA/(BPDA + PMDA + BTDA) |  | 0.00 | 0.00 | 0.00 | 1.00 | 0.03 | 0.60 | 0.15 |
| p-PDA | Amount (g) | 6.98 | 6.98 | 6.98 | 8.53 | 7.02 | 7.84 | 7.11 |
|  | Mol | 0.0645 | 0.0645 | 0.0645 | 0.0789 | 0.0649 | 0.0725 | 0.0657 |
| ODA | Amount (g) | 3.26 | 3.26 | 3.26 | 3.97 | 3.27 | 3.65 | 3.31 |
|  | Mol | 0.0163 | 0.0163 | 0.0163 | 0.0198 | 0.0163 | 0.0182 | 0.0165 |
| p-PDA/(p-PDA + ODA) |  | 0.80 | 0.80 | 0.80 | 0.80 | 0.80 | 0.80 | 0.80 |
| Diamine/Dianhydride |  | 1.0013 | 1.0013 | 1.0013 | 1.0014 | 1.0009 | 1.0019 | 1.0015 |
| Talc | Amount (g) | 0.00 | 3.40 | 6.80 | 6.80 | 6.80 | 6.80 | 6.80 |
|  | Ratio (wt %) | 0 | 10 | 20 | 20 | 20 | 20 | 20 |
| NMP | Amount (ml) | 166.00 | 166.00 | 166.00 | 166.00 | 166.00 | 166.00 | 166.00 |
| Solid content (wt %) |  | 17.00 | 18.38 | 19.72 | 19.73 | 19.72 | 19.73 | 19.73 |
| Plasma treatment |  | ○ | ○ | x | ○ | ○ | ○ | ○ |

Example 9

9-1. Preparation of a Polyamic Acid Solution

Through a 4-neck reaction vessel provided with a thermometer, a stirrer, a nitrogen inlet and a powder dispensing funnel, nitrogen gas was slowly passed, while 166 ml of N-methyl pyrrolidone (NMP) and 6.8 g (20 wt %) of talc powder were added, followed by stirring. To the solution, 7.18 g (0.0664 mol) of p-phenylenediamine (p-PDA) and 3.36 g (0.0168 mol) of 4,4'-oxydianiline (ODA) were added, and the resultant mixture was completely dissolved by being stirred at 25° C. To the resultant solution, 21.77 g (0.0740 mol) of 3,3',4,4'-biphenyltetracarboxylic acid dianhydride (BPDA) and 1.79 g (0.0082 mol) of pyromellitic dianhydride (PMDA) were slowly added, and the mixture was polymerized by being stirred for 10 hours so as to provide a polyamic acid solution having a viscosity of 25,000 cps.

Then, a solution including 0.68 g (2 wt %) of epoxy resin (bisphenol A, SER-10) dissolved in 3.4 ml of N-methyl pyrrolidone (NMP) was added to the above prepared polyamic acid solution, and the mixture was stirred for 2 hours so as to provide a final polyamic acid solution having a viscosity of 22,000 cps.

9-2. Fabrication of Flexible Copper Clad Laminate

By using a casting method, the prepared polyamic acid solution was coated on the surface of an electrolytic copper clad having a thickness of 18 μm. Herein, the thickness of the coating was adjusted in such a manner that the thickness of the final polyimide resin layer after the curing step can be 25 μm. Then, the coated polyamic acid solution was dried at from about 50 to 200° C. through several steps for from about 10 to 40 minutes. Then, the temperature was raised up to about 250 to 400° C. while an imidization reaction was carried out so as to provide a flexible copper clad laminate formed with a polyimide layer.

Example 10

A polyamic acid solution and a flexible copper clad laminate were prepared in the same manner as in Example 9, except that 20.75 g (0.0705 mol) of 3,3',4,4'-biphenyltetracarboxylic acid dianhydride (BPDA) and 2.71 g (0.0124 mol) of pyromellitic dianhydride (PMDA) were used, instead of 21.77 g (0.0740 mol) of 3,3',4,4'-biphenyltetracarboxylic acid dianhydride (BPDA) and 1.79 g (0.0082 mol) of pyromellitic dianhydride (PMDA).

Then, by using an atmospheric plasma generator, on the surface of the polyimide layer of the flexible copper clad laminate obtained as described above, atmospheric plasma treatment was carried out. Herein, the conditions for atmospheric plasma treatment are the same as those in Example 2.

Example 11

A polyamic acid solution and a flexible copper clad laminate were prepared in the same manner as in Example 9, except that 3.4 g (10 wt %) of epoxy resin (bisphenol A, SER-10) was used, instead of 0.68 g (2 wt %) of epoxy resin (bisphenol A, SER-10).

Then, by using an atmospheric plasma generator, on the surface of the polyimide layer of the flexible copper clad laminate obtained as described above, atmospheric plasma treatment was carried out. Herein, the conditions for atmospheric plasma treatment are the same as those in Example 2.

Experimental Example 1

Test on Properties of a Flexible Copper Clad Laminate

In order to test the properties of each of flexible copper clad laminates obtained from Examples 1 to 11, and Comparative Example 1 to 7, measurements below were carried out. The results are noted in Table 3 below.

1-1. Peel Strength

A bonding prepreg [Doosan Electronics BG, DS-7402BS (DFP)] was adhered on the surface of a polyimide layer of a flexible copper clad laminate for 60 minutes. Then, under a temperature condition of 25° C., when the bonding prepreg was peeled off with respect to the surface of the laminate at a right angle at a speed of 50 mm/min, the minimum of a force required for the peeling-off was measured. The force was considered as a peel strength.

1-2. Peel Strength of Copper Clad

In accordance with IPC-TM-650 No. 2,4,9, a flexible copper clad laminate was formed with a circuit having a pattern width of 1 mm, and under a temperature condition of 25° C., the minimum of force required for peeling off a copper clad with respect to the surface of the laminate at a right angle at a speed of 50 mm/min was measured. This force was considered as a peel strength of a copper clad.

1-3. Flexibility (MIT)

On the surface formed with a circuit of a flexible copper clad laminate, a coverlay (PI Film 12 μm, adhesive 25 μm) was attached so as to provide a flexibility test sample. The test sample was mounted in an MIT flexibility test device. Then, while a tool having a curvature radius of 0.38R was rubbed against the test sample at a speed of 175 rpm, the number of rubbings until the mounted test sample was broken was measured. Herein, according to the number of rubbings, the flexibility was determined as described below.

less than 2,000: bad,
2,000 to 5,000: normal
greater than 5,000: good 1-4. Curling When a flexible copper clad laminate (10 cm×10 cm) was settled on a flat surface, the average height (mm) from respective edges to the plane of the flexible copper clad laminate in a concave form was measured. Herein, according to the height from the edges to the plane, the curling was determined as described below.

0 to 10 mm: good
greater than 10 mm-20 mm or less: normal
greater than 20 mm: bad

TABLE 3

| | peel strength (kgf/cm) | copper clad peel strength (kgf/cm) | flexibility | curling |
|---|---|---|---|---|
| Exp. 1 | 0.70 | 1.10 | Good(7300) | good |
| Exp. 2 | 1.00 | 1.10 | good(7300) | good |
| Exp. 3 | 1.00 | 1.10 | good(6900) | good |
| Exp. 4 | 1.10 | 1.20 | good(7500) | good |
| Exp. 5 | 1.15 | 1.30 | good(7800) | normal |
| Exp. 6 | 1.15 | 0.90 | good(6000) | good |
| Exp. 7 | 1.30 | 0.80 | normal(4500) | good |
| Exp. 8 | 1.15 | 0.95 | normal(4300) | normal |
| Exp. 9 | 0.85 | 1.20 | good(5200) | good |
| Exp. 10 | 1.10 | 1.20 | normal(5200) | good |
| Exp. 11 | 1.25 | 1.40 | bad(1900) | good |
| Comp. Exp. 1 | 0.60 | 0.65 | good(9800) | bad |
| Comp. Exp. 2 | 0.80 | 0.90 | good(8600) | normal |
| Comp. Exp. 3 | 0.70 | 1.20 | good(7800) | normal |
| Comp. Exp. 4 | 0.90 | 0.40 | normal(2200) | good |
| Comp. Exp. 5 | 0.70 | 1.20 | good(7600) | normal |
| Comp. Exp. 6 | 1.00 | 0.70 | normal(3900) | good |
| Comp. Exp. 7 | 1.00 | 1.05 | normal(4900) | normal |

As a result, the flexible copper clad laminate of Comparative Example 1 showed very poor properties in view of peel strength, copper clad peel strength, flexibility, and curling, and also the flexible copper clad laminates of Comparative Examples 2 to 7 generally showed poor properties. On the other hand, all of the inventive Examples showed good properties in view of basic properties required for a flexible copper clad laminate (such as peel strength, copper clad peel strength, flexibility, and curling).

INDUSTRIAL APPLICABILITY

The polyamic acid solution according to the present invention includes 3,3',4,4'-biphenyltetracarboxylic acid dianhydride, (BPDA), and pyromellitic dianhydride (PMDA) as aromatic tetracarboxylic acid dianhydride, and thus may be used for preparing a polyimide resin with improved adhesive strength without deterioration of various properties such as flexibility, curling, heat resistance, chemical resistance, electrical characteristics.

Also, a flexible metal clad laminate employing the polyimide resin according to the present invention can be easily adhered to a bonding prepreg due to the polyimide resin having the improved adhesive strength, and thus can be easily used in the fabrication of a multilayer PCB.

Although several exemplary embodiments of the present invention have been described for illustrative purposes, those skilled in the art will appreciate that various modifications, additions and substitutions are possible, without departing from the scope and spirit of the invention as disclosed in the accompanying claims.

The invention claimed is:

1. A polyamic acid solution comprising:
   (a) 3,3',4,4'-biphenyltetracarboxylic acid dianhydride, and pyromellitic dianhydride as an aromatic tetracarboxylic acid dianhydride;
   (b) at least one aromatic diamine comprising p-phenylenediamine and 4,4'-oxydianiline;
   (c) an organic solvent; and
   (d) an inorganic filler,
   wherein the p-phenylenediamine and the 4,4'-oxydianiline are used in a ratio range of 55-85:15-45 mol %,
   said at least one aromatic tetracarboxylic acid dianhydride (a) and said at least one aromatic diamine (b) are mixed in a ratio range of a:b=1.05:1.00-1.00:1.05 mol, and
   the polyamic acid has a viscosity of 3,000 to 50,000 cps.

2. The polyamic acid solution as claimed in claim 1, wherein the 3,3',4,4'-biphenyltetracarboxylic acid dianhydride and the pyromellitic dianhydride are used in a ratio range of 50-95:5-50 mol %.

3. The polyamic acid solution as claimed in claim 1, wherein the inorganic filler includes selected from the group consisting of talc, mica, silica, calcium carbonate, magnesium carbonate, clay, calcium silicate, titanium oxide, antimony oxide, glass fiber, and a mixture thereof.

4. The polyamic acid solution as claimed in claim 1, wherein the inorganic filler is included in an amount of 1 to 25 wt %, with respect to the total weight of the aromatic tetracarboxylic acid dianhydride and the aromatic diamine.

5. The polyamic acid solution as claimed in claim 1, which further comprises an epoxy resin.

6. The polyamic acid solution as claimed in claim 5, wherein the epoxy resin is included in a range of 1 to 10 wt % with respect to the total weight of the aromatic tetracarboxylic acid dianhydride and the aromatic diamine.

7. A flexible metal clad laminate comprising:
   a metal clad layer; and
   a polyimide resin layer formed on one surface of a metal clad layer,
   wherein the polyimide resin layer is formed by imidization of the polyamic acid solution as claimed in claim 1,
   the polyamic acid solution comprising:
   (a) 3,3',4,4'-biphenyltetracarboxylic acid dianhydride, and pyromellitic dianhydride as aromatic tetracarboxylic acid dianhydride;
   (b) at least one aromatic diamine comprising p-phenylenediamine and 4,4'-oxydianiline;
   (c) an organic solvent; and
   (d) an inorganic filler,
   wherein the p-phenylenediamine and the 4,4'-oxydianiline are used in a ratio range of 55-85:15-45 mol %,
   said at least one aromatic tetracarboxylic acid dianhydride (a) and said at least one aromatic diamine (b) are mixed in a ratio range of a:b=1.05:1.00-1.00:1.05 mol, and
   the polyamic acid has a viscosity of 3,000 to 50,000 cps.

8. The flexible metal clad laminate as claimed in claim 7, wherein a surface of the polyimide resin layer is subjected to atmospheric plasma treatment.

9. A printed circuit board comprising the flexible metal clad laminate as claimed in claim 7.

10. A method for preparing a flexible metal clad laminate, the method comprising the steps of:
   coating a polyamic acid solution as claimed in claim 1, on a metal clad; and
   heating the polyamic acid solution coated on the metal clad so as to form a polyimide resin layer on the metal clad.

11. The method as claimed in claim 10, which further comprises the step of performing atmospheric plasma treatment on a surface of the polyimide resin layer.

12. The flexible metal clad laminate as claimed in claim 7, wherein the 3,3',4,4'-biphenyltetracarboxylic acid dianhydride and the pyromellitic dianhydride are used in a ratio range of 50-95:5-50 mol %.

13. The flexible metal clad laminate as claimed in claim 7, the polyamic acid solution further comprises an epoxy resin.

14. The printed circuit board as claimed in claim 9, wherein a surface of the polyimide resin layer is subjected to atmospheric plasma treatment.

* * * * *